United States Patent [19]

Furukawa

[11] Patent Number: 4,459,580
[45] Date of Patent: Jul. 10, 1984

[54] DA CONVERTER
[75] Inventor: Yasuo Furukawa, Gyoda, Japan
[73] Assignee: Takeda Riken Kogyo Kabushikikaisha, Tokyo, Japan
[21] Appl. No.: 385,255
[22] Filed: Jun. 4, 1982
[30] Foreign Application Priority Data
  Jun. 10, 1981 [JP] Japan .................... 56-90061
[51] Int. Cl.³ .......................... H03K 13/02
[52] U.S. Cl. .......................... 340/347 DA
[58] Field of Search .... 340/347 DA, 347 M, 347 AD

[56] References Cited
U.S. PATENT DOCUMENTS
  2,782,408  2/1957  Fisher et al. ............ 340/347 DA Primary Examiner—C. D. Miller

[57] ABSTRACT

A plurality of resistance elements are connected via cutoff switches to form a ring. One of the connection points of each cutoff switch with the respective resistance element is connected via a feed switch to a common power source and via an output switch to a common output terminal. The other connection point of each cutoff switch with a resistance elements is connected via a grounding switch to a common potential point. An operation of turning OFF one of the cutoff switches, simultaneously turning ON the feed switch and the grounding switch on both sides of the turned-OFF cutoff switch, and turning ON the output switch selected in accordance with an input digital value, is repeated with a fixed period for all of the cutoff switches in a sequential order, while retaining the relative positions of the switches on the ring. By smoothing the output at the output terminal, scattered resistance values of the resistance elements are averaged. The invention is also applicable to a ladder network, and includes other modifications.

23 Claims, 59 Drawing Figures

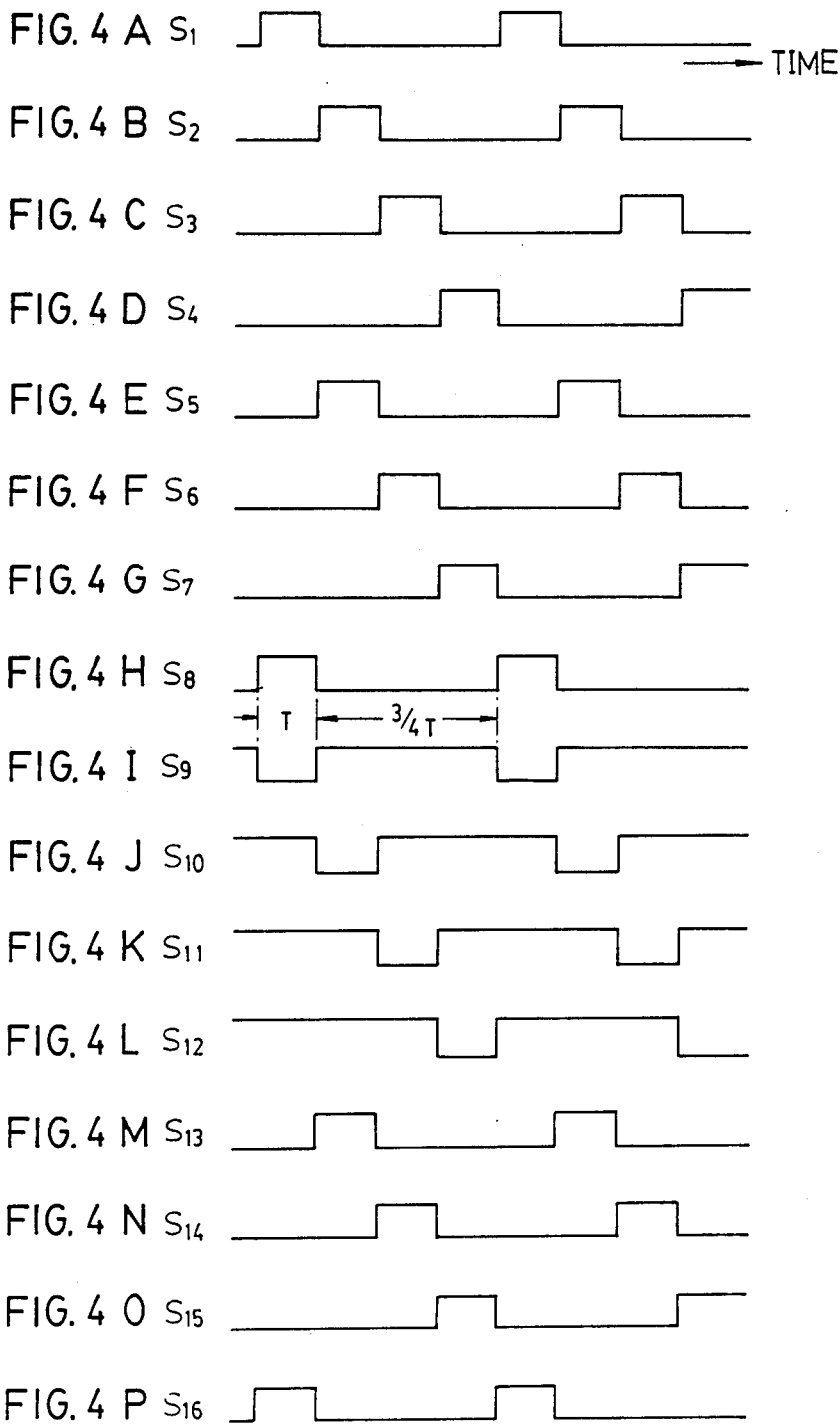

FIG. 10 C
FIG. 10 D
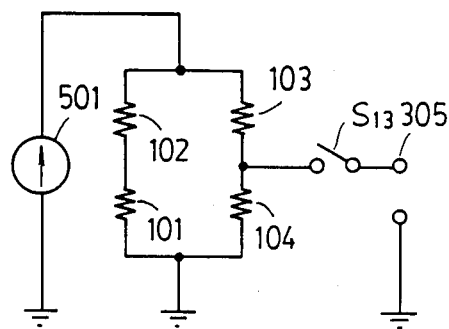
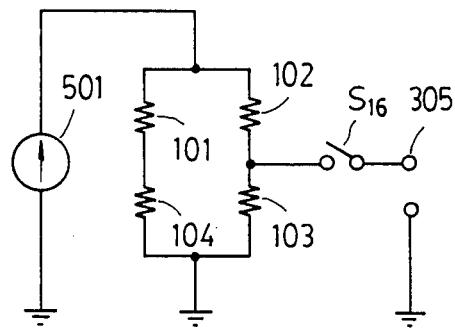
FIG. 11 A
FIG. 11 B
FIG. 12
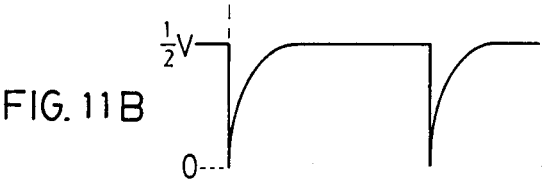
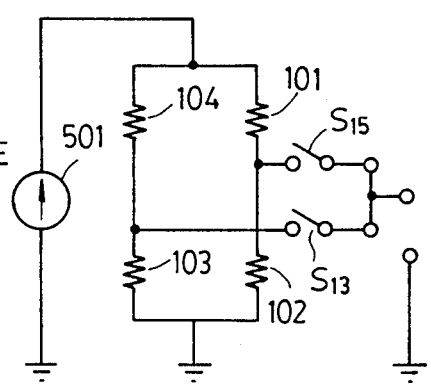

FIG. 15A $S_{32}S_{33}S_1$ $S_{23}\bar{S}_{16}$  →TIME
FIG. 15B $S_{25}S_{34}S_2$ $S_{24}\bar{S}_9$ 
FIG. 15C $S_{26}S_{35}S_3$ $S_{17}\bar{S}_{10}$ 
FIG. 15D $S_{27}S_{36}S_4$ $S_{18}\bar{S}_{11}$ 
FIG. 15E $S_{28}S_{37}S_5$ $S_{19}\bar{S}_{12}$ 
FIG. 15F $S_{29}S_{38}S_6$ $S_{20}\bar{S}_{13}$ 
FIG. 15G $S_{30}S_{39}S_7$ $S_{21}\bar{S}_{14}$ 
FIG. 15H $S_{31}S_{40}S_8$ $S_{22}\bar{S}_{15}$ 
FIG. 15 I $S_{33}\bar{S}_{25}$ 
FIG. 15 J $S_{34}\bar{S}_{26}$ 
FIG. 15 K $S_{35}\bar{S}_{27}$ 
FIG. 15 L $S_{36}\bar{S}_{28}$ 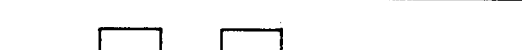
FIG. 15M $S_{37}\bar{S}_{29}$ 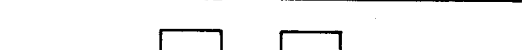
FIG. 15N $S_{38}\bar{S}_{30}$ 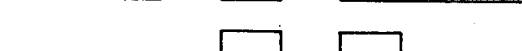
FIG. 15 O $S_{39}\bar{S}_{31}$ 
FIG. 15P $S_{40}\bar{S}_{32}$ 

DA CONVERTER

BACKGROUND OF THE INVENTION

The present invention relates to a DA converter for converting an input digital value into an analog signal.

There is known in the art such a DA converter in which a plurality of resistors are connected in series, a fixed voltage is applied across the series connection, the connection points of the resistors are respectively connected via switches to an output terminal and one of the switches is turned ON in accordance with an input digital value, whereby to obtain an analog voltage at the output terminal. In another conventional DA converter, a power source is connected to one end of a ladder network composed of series resistors of a resistance value R and shunt resistors of a resistance value 2R in each section and, by effecting such a control that the shunt resistors of the respective sections of the ladder network are connected to an output amplifier or a common potential point corresponding to respective bits of the input digital value, an analog output is obtained.

In such prior art DA converters, it is necessary to enhance the accuracy of the resistance value of each resistor according to the required conversion accuracy. To obtain a resistor of high resistance value, it is customary in the prior art to employ a winding resistor formed by a resistance wire of extremely small temperature coefficient and to adjust each resistance value with high accuracy. This adjustment is troublesome, and hence makes the DA converter expensive and, in addition, the use of such a winding resistor makes the DA converter bulky.

SUMMARY OF THE INVENTION

It is therefore an object of the present invention to provide a DA converter which is capable of producing a converted output of high accuracy even if there is some dispersion in the resistance values of the resistance elements used.

Another object of the present invention is to provide a DA converter which is inexpensive, small in size and is able to yield a converted output of high accuracy.

According to the present invention, N (an integer larger than unity) resistance elements and cutoff switches are connected alternately to form a ring. One of the connection points of each cutoff switch with a terminal of the respective resistance element is connected via a feed switch to one end of a common power source and connected via an output switch to a common output terminal. The other connection point of the cutoff switch with the resistance elements is connected via a grounding switch to the other end of the power source. An operation of simultaneously turning OFF one of the cutoff switches and turning ON the feed switch and the grounding switch connected to both ends of the turned-OFF cutoff switch is repeated with a fixed period for all of the cutoff switches in a sequential order under the control of source supply control means. An operation of selectively turning ON the output switches in accordance with an input digital value while retaining the relative position of the turned ON output switch to the turned OFF cutoff switch on the aforementioned ring is carried out by output control means in synchronism with the source supply control means. In this way, outputs at the same voltage dividing point in all combinations of connections of the resistance elements are sequentially taken out at the same periods. By smoothing the outputs, an output is provided which is free from the influence of dispersion in the resistance value of the resistance elements.

In the case of forming a ladder network type DA converter, short-circuit switches are respectively connected in parallel to the resistance elements in the abovesaid structure, and the grounding switches are respectively connected to the connection points of the cutoff switches, the feed switches and the resistance elements. At each connection point, one end of the output switch on the opposite side from the output terminal and one end of the grounding switch on the opposite side from the power source are interconnected, and a second resistance element is connected between the connection point of the output switch and the grounding switch and a corresponding one of the connection points of the cutoff switch, the feed switch and the resistance element. The resistance value of the second resistance element is selected to be twice that of the aforesaid resistance element. The source supply control means turns ON the short-circuit switch connected to the turned-ON grounding switch on the opposite side from the turned-OFF cutoff switch. The output control means turns ON one of the interconnected output switch and grounding switch except the grounding switch turned ON by the steady control means, corresponding to respective bits of the input digital value.

Further, in the aforementioned voltage dividing type structure, a constant-current source is used as a power source, the cutoff switches are omitted, and the resistance elements are connected in the form of a ring. The operation of turning ON the feed switches and the grounding switches by the source supply control means is carried out for different connection points on the resistance element ring, and a path from one end to the other of the constant-current source is formed by two series resistance element groups and the output switches in one of the two groups are turned ON by the output control means. With such an arrangement, the number of switches used can be reduced.

BRIEF DESCRIPTION OF THE DRAWINGS

FIGS. 4A to 4P show a timing chart illustrating control of switches in FIG. 3;

FIGS. 11A and 11B are diagrams showing noise generation at the time of switch changeover in the converter depicted in FIG. 9;

FIG. 12 is a diagram showing an example of a circuit arrangement for suppressing the generation of switch noise in the converter of FIG. 9;

FIG. 15 is a timing chart showing, by way of example, switch changeover operations of the converter depicted in FIG. 14;

DETAILED DESCRIPTION OF THE PREFERRED EMBODIMENTS

Figure 1:
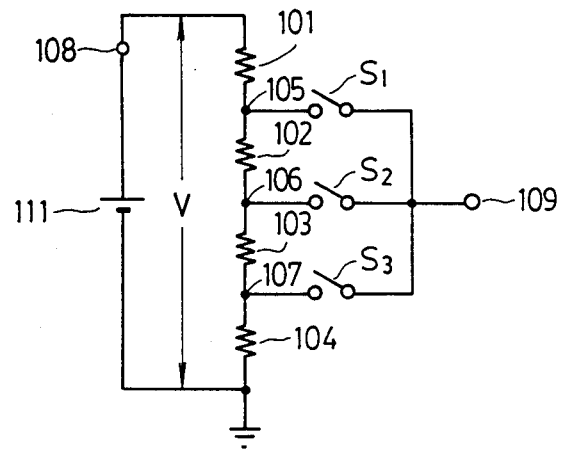
FIG. 1 is a connection diagram showing a conventional voltage dividing type DA converter.
Figure 2A:
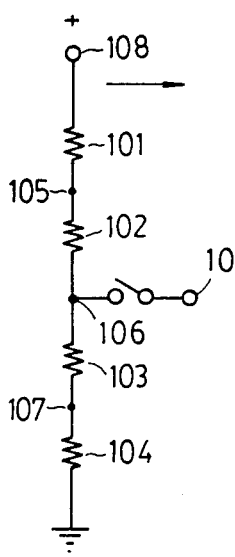
FIGS. 2A to 2D are explanatory of the principle of the present invention, showing switching of resistors and an output taking out point.
Figure 2B:
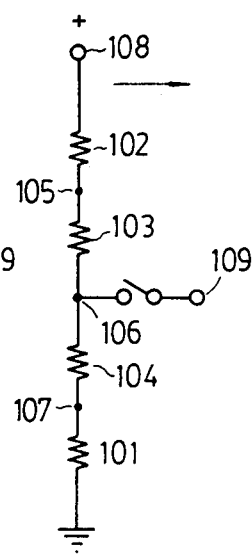
Figure 2C:
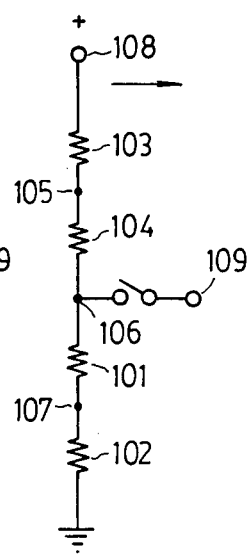
Figure 2D:
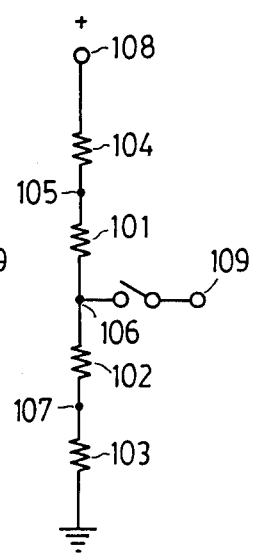

To facilitate a better understanding of the present invention, a description will be given first, with reference to FIG. 1, of a conventional voltage dividing type DA converter. Four resistors 101, 102, 103 and 104 of the same resistance value are connected in series, and both ends of the series connection are connected to a constant-voltage source 111. First, second and third connection points of the resistors, counted from one end of the constant-voltage source 111, that is, voltage dividing points 105, 106 and 107, are connected to an output terminal 109 via switches $S_1$, $S_2$ and $S_3$, respectively. Letting the voltage of the constant-voltage source 111 be represented by V, 3/4V, 2/4V and 1/4V are derived at the voltage dividing points 105, 106 and 107, respectively. In accordance with an input digital value any one of the switches $S_1$, $S_2$ and $S_3$ is turned ON and a selected one of the voltage-divided voltage is provided to the output terminal 109, thus obtaining an analog voltage corresponding to the digital value. For obtaining a correct converted output, it is necessary that the voltage-divided voltages accurately bear a ratio 3:2:1. To perform this, all the resistors 101, 102, 103 and 104 must have exactly the same resistance value. In practice, however, it is difficult to make the resistance values of the resistors 101, 102, 103 and 104 exactly equal because of dispersion in the resistance value. In the prior art, the resistors are formed in the shape of windings and their resistance values are adjusted accurately, or the resistors are formed as thick films on a ceramic material and their resistance values are adjusted by trimming the thick film resistors through laser trimming or the like, thereby to obtain a desired voltage dividing ratio. Accordingly, much labor is needed for the adjustment, resulting in raised manufacturing costs of a DA converter. In the case of forming the resistors in the shape of windings, there is also such a defect that the DA converter inevitably becomes bulky.

FIGS. 2A to 2D are explanatory of the principle of the present invention. As illustrated in FIGS. 2A to 2D, the connections of the resistors 101 to 104 to the power source are sequentially changed over. That is to say, in FIG. 2A, both ends of a series connection of the resistors 101-102-103-104 are connected to the power source; and in FIGS. 2B, 2C and 2D, both ends of a series connection of the resistors 102-103-104-101, both ends of a series connection of the resistors 103-104-101-102, and both ends of a series connection of the resistors 104-101-102-103 are connected to the power source, respectively. While it is arranged that a voltage at the same voltage dividing point, for instance, at the voltage dividing point 106 second from the power source terminal 108 may be derived at the output terminal 109 in accordance with the input digital value regardless of such sequential switching as mentioned above. In this case, the output voltages available at the output terminal 109 in FIGS. 2A to 2D assume the following values, respectively:

$$\frac{R_3 + R_4}{R} V \quad \text{(A)}$$

$$\frac{R_4 + R_1}{R} V \quad \text{(B)}$$

$$\frac{R_1 + R_2}{R} V \quad \text{(C)}$$

$$\frac{R_2 + R_3}{R} V \quad \text{(D)}$$

where $R_1$, $R_2$, $R_3$ and $R_4$ are resistance values of the resistors 101, 102, 103 and 104, which bear a relation $R = R_1 + R_2 + R_3 + R_4$, where R is substantially constant during the operation.

Assuming that the connections shown in FIGS. 2A to 2D are changed over at regular intervals of a fixed time T, a mean value $V_A$ of the voltage at the output terminal 109 is given as follows:

$$V_A = \frac{1}{4T}\left( \frac{R_3 + R_4}{R} \cdot V \cdot T + \frac{R_4 + R_1}{R} \cdot V \cdot T + \frac{R_1 + R_2}{R} \cdot V \cdot T + \frac{R_2 + R_3}{R} \cdot V \cdot T \right) = \tfrac{1}{2}V$$

From the above it is seen that the mean value $V_A$ is not dependent on the resistance values of the resistors 101 to 104. The same is true of other voltage dividing points 105 and 107.

Accordingly, by sequentially changing over the resistors 101 to 104 as shown in FIGS. 2A-2D and obtaining the output from the same voltage dividing point, a voltage-divided voltage, that is, an analog output which is not dependent on the resistance values of the resistors 101 to 104 can be obtained.

Figure 3:
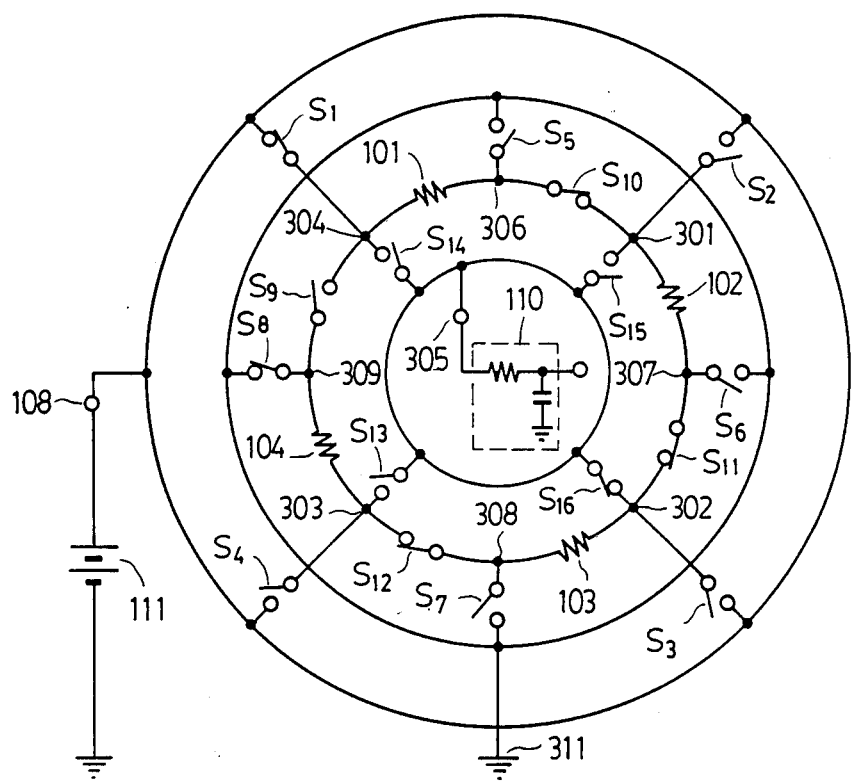
FIG. 3 is a connection diagram illustrating an embodiment of the present invention as being applied to a voltage dividing type DA converter.

FIG. 3 illustrates a specific arrangement for changing over the resistors 101 to 104 as shown in FIGS. 2A-2D. The resistors 101 to 104 are interconnected in the form of a ring respectively via cutoff switches $S_9$, $S_{10}$, $S_{11}$ and $S_{12}$. Output switches $S_{15}$, $S_{16}$, $S_{13}$ and $S_{14}$ are respectively connected at one end to connection points 301, 302, 303 and 304 of the cutoff switches $S_{10}$, $S_{11}$, $S_{12}$ and $S_9$ with the resistors 102, 103, 104 and 101. The other ends of the output switches $S_{13}$, $S_{14}$, $S_{15}$ and $S_{16}$ are connected together to an output terminal 305. Grounding switches $S_5$, $S_6$, $S_7$ and $S_8$ are respectively connected at one end to connection points 306, 307, 308 and 309 of the resistors 101, 102, 103 and 104 with the cutoff switches $S_{10}$, $S_{11}$, $S_{12}$ and $S_9$, and the other ends of these grounding switches are connected together to a common potential point 311. On the other hand, feed switches $S_1$, $S_2$, $S_3$ and $S_4$ are respectively connected at one end to the connection points 304, 301, 302 and 303 of the resistors 101, 102, 103 and 104 and the cutoff switches $S_9$, $S_{10}$, $S_{11}$ and $S_{12}$, and the other ends of the feed switches $S_1$ to $S_4$ are connected together, for example, to the positive voltage terminal 108 of the constant-voltage source 111. Connected to the output terminal 305 is a smoothing circuit 110 for averaging the voltage available at the terminal 305.

In such an arrangement, the feed switches $S_1$ to $S_4$ are controlled to be turned ON for the time T in a sequential order as shown in FIGS. 4A to 4D. The grounding switches $S_5$ to $S_8$ are controlled to be turned ON for the time T one after another in synchronism with the feed switches $S_2$, $S_3$, $S_4$ and $S_1$, respectively, as depicted in FIGS. 4E to 4H. The cutoff switches $S_9$ to $S_{12}$ are controlled to be turned OFF for the time T one after another in synchronism with the feed switches $S_1$ to $S_4$, respectively, and to be turned ON for the remaining 3/4T time as shown in FIGS. 4I to 4L. In this example in which the voltage at the voltage dividing point second from the power source terminal 108 is taken out, the output switches $S_{13}$ to $S_{18}$ are controlled to be sequentially turned ON for the time T in synchronism with the switches $S_5$ to $S_8$, respectively, as shown in FIGS. 4M to 4P.

In the case where the timing for turning ON the output switches $S_{13}$ to $S_{16}$ is advanced by the time T with respect to the case of FIGS. 4M-4P while keeping the sequential turning ON in synchronism with the feed switches $S_1$ to $S_4$ respectively, there is derived at the output terminal 305 the voltage at the voltage dividing point 105 first from the power source terminal 108 referred to previously in respect of FIG. 1. When the timing for turning ON the output switches $S_{13}$ to $S_{16}$ is delayed by the time T with respect to the case of FIGS. 4M-4P, the voltage at the voltage dividing point 107 third from the power source terminal 108 (FIG. 1) is obtained at the output terminal 305.

By ON-OFF control of the switches $S_1$ to $S_{12}$ at the timing shown in FIGS. 4A to 4L and by ON-OFF control of the output switches $S_{13}$ to $S_{16}$ at appropriate timing with respect to the abovesaid timing as described above, there can be obtained at the output terminal 305, as mean outputs, voltages 1/4V, 2/4V and 3/4 relative to the voltage V of the voltage source 111. In addition, these voltage-divided voltages accurately bear the ratio 1:2:3 independently of the resistance values of the resistors 101 to 104 as described previously.

In the control of the switches in FIG. 3, the feed switch and the grounding switch connected to both ends of a selected one of the cutoff switches $S_9$–$S_{12}$ are simultaneously turned ON for the fixed time T when the selected cutoff switch is turned OFF; this operation is repeated for each of the cutoff switches $S_9$ to $S_{12}$ in a sequential order. As for the output switches $S_{13}$ to $S_{16}$, an operation of turning ON an output switch spaced a predetermined number of resistors from the turned-OFF cutoff switch in accordance with the input digital value is repeated for each of the output switches while retaining the relative position of each turned-OFF cutoff switch and the turned-ON output switch on the resistor ring, whereby the output switches are sequentially turned ON.

Figure 5:
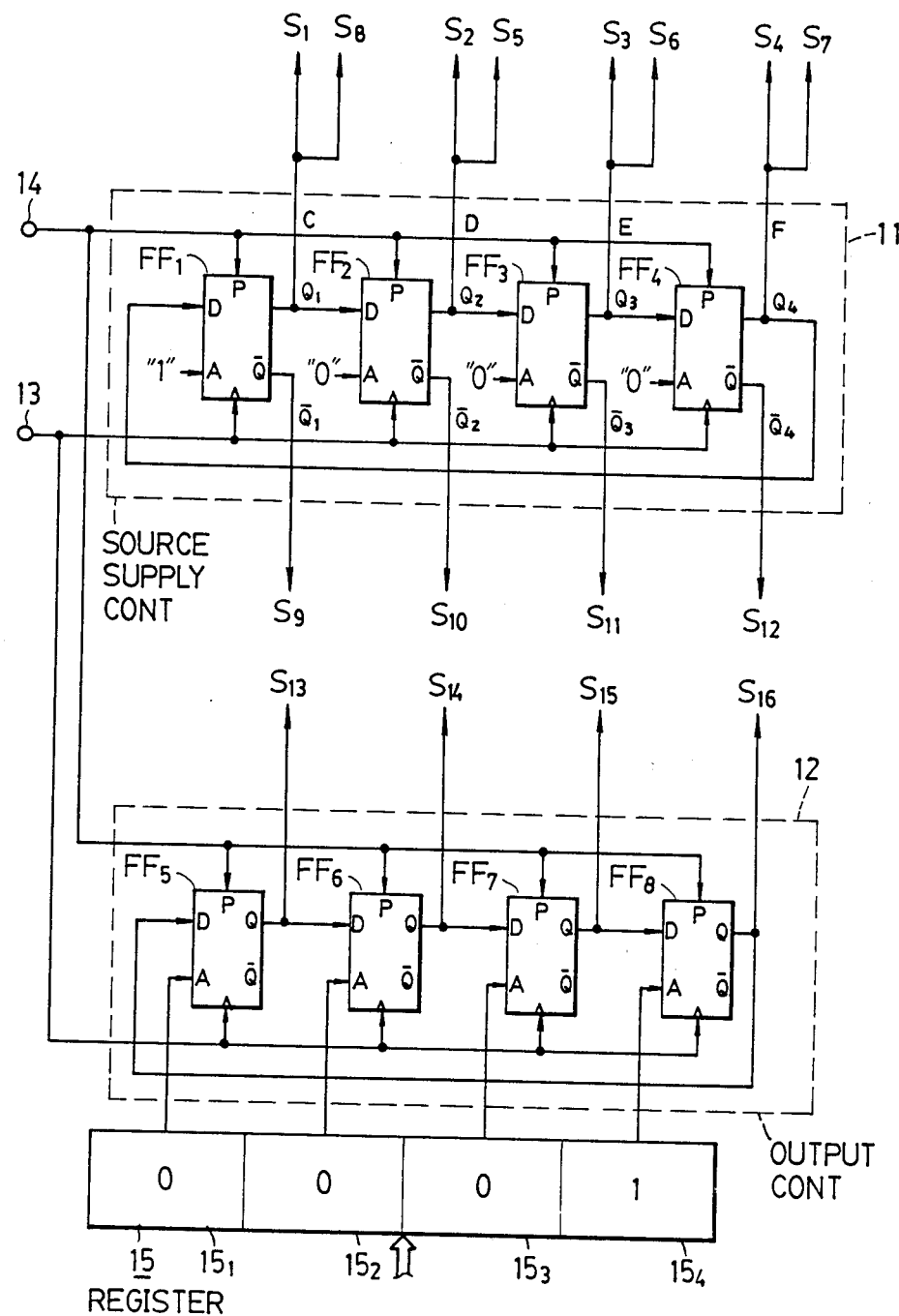
FIG. 5 is a connection diagram illustrating, by way of example, a switch controller.

FIG. 5 illustrates, by way of example, a controller for controlling the switches as described above. The controller comprises a source supply control section 11 for controlling the switches $S_1$ to $S_{12}$ and an output control section 12 for controlling the output switches $S_{13}$ to $S_{16}$.

In the source supply control section 11, for example, D flip-flops $FF_1$ to $FF_4$ are cascade connected; a Q output of the last stage flip-flop $FF_4$ is fed back to a data terminal D of the first stage flip-flop $FF_1$; a preset data terminal A of the first stage flip-flop $FF_1$ is supplied with high-level data "1"; and preset data terminals A of the other flip-flops $FF_2$ and $FF_4$ are each supplied with low-level data "0". The source supply control section 11 is constituted as a circulating shift register which carries out a shift operation upon each application of a clock pulse to a clock terminal of each of the flip-flops $FF_1$ to $FF_4$ from a terminal 13.

Figure 6:
FIG. 6 is a timing chart explanatory of the operation of the controller shown in FIG. 5.
Figure 6:
Figure 6:
Figure 6:
Figure 6:
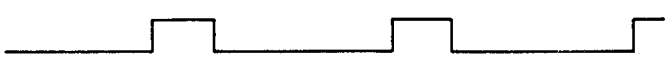
Figure 6:

Upon application of a load instruction to the preset terminal of each of the flip-flops $FF_1$ to $FF_4$ from a load terminal 14 at a moment $t_1$ as shown in FIG. 6A, the flip-flops $FF_1$, $FF_2$, $FF_3$ and $FF_4$ are preset to "1", "0", "0" and "0", respectively, as depicted in FIGS. 6C to 6F, and this data pattern is shifted upon each occurrence of the clock pulse at the terminal 13 shown in FIG. 6B. The period of this clock pulse is selected to be T. By Q outputs $Q_1$, $Q_2$, $Q_3$ and $Q_4$ from the flip-flops $FF_1$, $FF_2$, $FF_3$ and $FF_4$ are respectively controlled the feed switches $S_1$, $S_2$, $S_3$ and $S_4$ and the grounding switches $S_8$, $S_5$, $S_6$ and $S_7$. And by $\bar{Q}$ outputs $\bar{Q}_1$, $\bar{Q}_2$, $\bar{Q}_3$ and $\bar{Q}_4$ from the flip-flops $FF_1$, $FF_2$, $FF_3$ and $FF_4$ are controlled the cutoff switches $S_9$, $S_{10}$, $S_{11}$ and $S_{12}$ in FIG. 3.

The output control section 12 also constitutes a circulating shift register by the cascade connection of D flip-flops $FF_5$ to $FF_8$ similar to those employed in the source supply control section 11, and performs a shift operation with the clock pulse from the terminal 13 for synchronization with the source supply control section 11. The load instruction from the terminal 14 is also provided to a preset terminal of each of the flip-flops $FF_5$ to $FF_8$. By this load instruction, respective bit data, for instance, "0", "0", "0" and "1" of an input digital value stored in respective bits $15_1$ to $15_4$ of a register 15 are preset in the flip-flops $FF_5$, $FF_6$, $FF_7$ and $FF_8$. By the Q outputs from the flip-flops $FF_5$ to $FF_8$ are controlled the output switches $S_{13}$ to $S_{16}$, respectively. The illustrated digital value of the register 15 in FIG. 5 is obtained in the case where the voltage at the voltage dividing point second from the power source terminal 108 is taken out. In the cases where digital values "1", "0", "0" and "0", and "0", "0", "1" and "0" are stored in the register 15, voltages at the voltage dividing points first and third from the power source terminal 108 are taken out, respectively.

Figure 7:
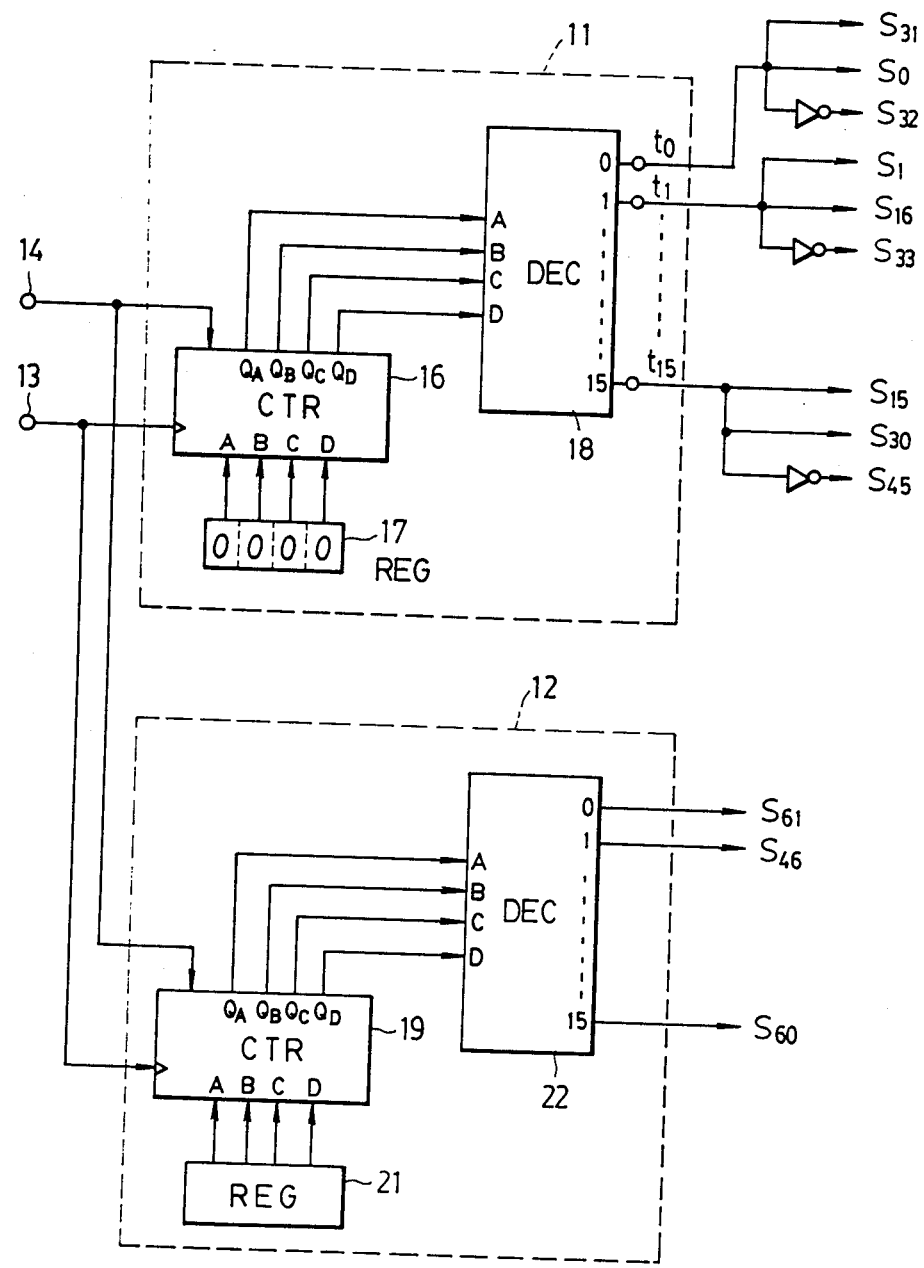
FIG. 7 is a connection diagram showing another example of the switch controller.

FIG. 7 illustrates another example of the controller, in which the source supply control section 11 includes a four-bit counter 16. Upon application of a load instruction to the counter 16 from the terminal 14, initial data in a register 17, for example, "0", "0", "0" and "0", are preset in the counter 16 and its count value is stepped one stage upon each occurrence of the clock pulse at the terminal 13. The count content of the counter 16 is decoded by a decoder 18 to provide an output at one of its 16 terminals $t_0$ to $t_{15}$. This example can be designed so that one of 16 voltage-divided voltages is yielded in accordance with the input digital value through using 16 resistors connected in the form of a ring. In this case, feed switches $S_0$ to $S_{15}$ are controlled by the outputs at the terminals $t_0$ to $t_{15}$, respectively; cutoff switches $S_{32}$ to $S_{45}$ are controlled by inverted outputs of the outputs at the abovesaid terminals, respectively; and grounding switches $S_{31}$ and $S_{16}$ to $S_{30}$ are controlled by the outputs at the terminals $t_0$ and $t_1$ to $t_{15}$, respectively.

Also in the output control section 12 is provided a similar four-bit counter 19. Upon application of a load instruction from the terminal 14 to the counter 19, a binary input digital value of four bits stored in a register 21 is preset in the counter 19 and its count content is stepped one stage upon each occurrence of the clock pulse at the terminal 13. The count content of the counter 19 is decoded by a decoder 22 and, by outputs at its output terminals $t_0$ and $t_1$ to $t_{15}$, output switches $S_{61}$ and $S_{46}$ to $S_{60}$ are controlled, respectively.

Figure 8:
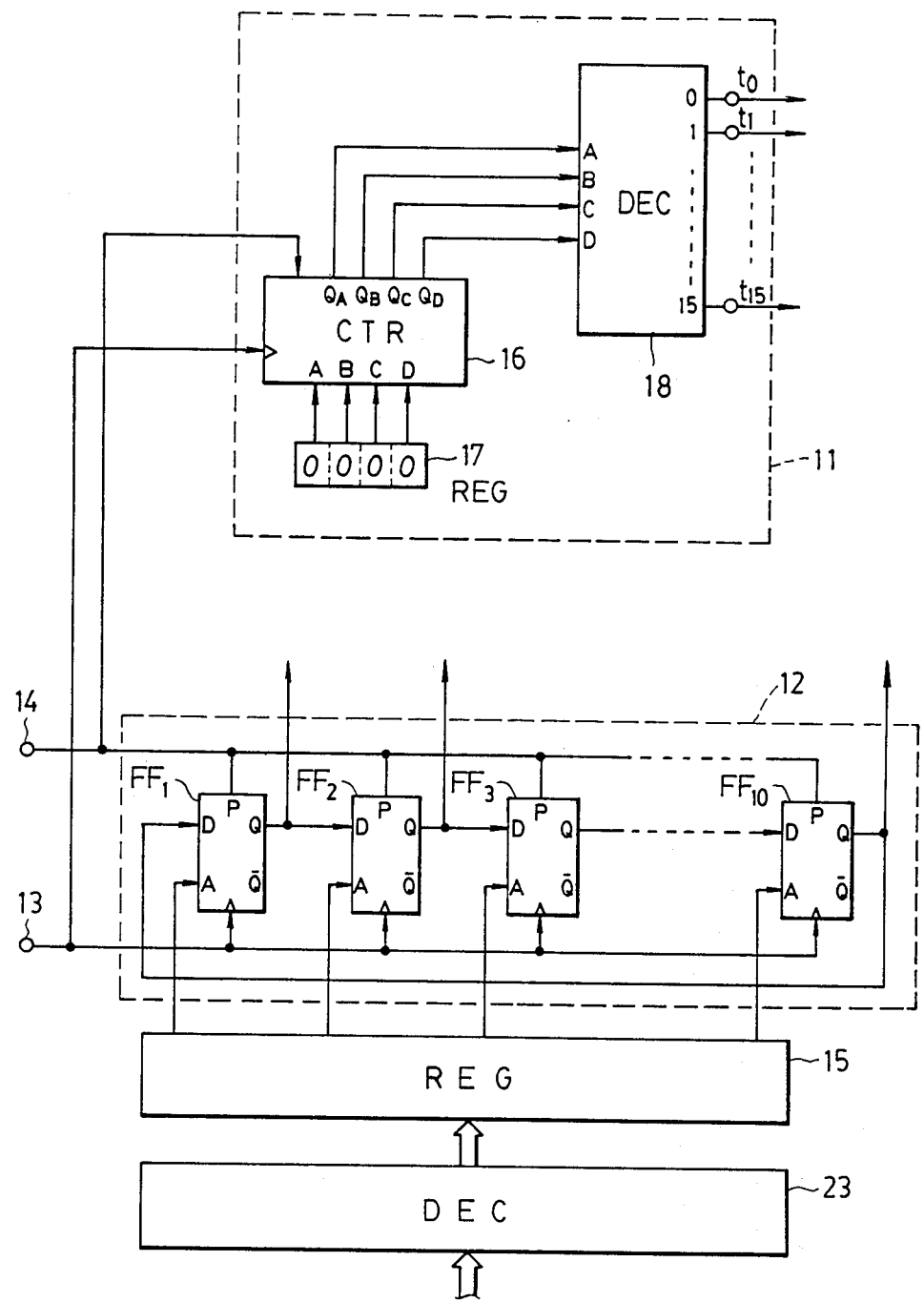
FIG. 8 is a connection diagram illustrating another example of the switch controller.

The controller may also be formed by the combined use of the shift register arrangement of FIG. 5 for either the source supply control section 11 or the output control section 12 and the counter-decoder arrangement of FIG. 7 for the other of them. For example, as shown in FIG. 8, the source supply control section 11 is formed using the counter 16 and the decoder 18, whereas the output control section 12 is formed using the shift register composed of the flip-flops $FF_1$ to $FF_{16}$. In the register 15 is stored a binary input digital value after being decoded by a decoder 23, for instance.

As the feed switches, cutoff switches, grounding switches and output switches, use can be made of, for example, analog switches which are formed by field effect transistors. It is true that the resistance values of the resistors 101 to 104 scatter, but their scattering is very small and they are substantially equal; therefore, a smoothing circuit 110 for averaging the output available at the output terminal 305 may be such a simple-structured one as shown in FIG. 3 which comprises one resistor and one capacitor. Since resistors of scattered resistance values can be used as described above, resistance elements built in a semiconductor integrated circuit can also be employed and, consequently, the DA converter of the present invention can be constituted as a semiconductor integrated circuit of high conversion accuracy. The scatter of the resistance values of the resistance elements of the semiconductor integrated circuit can easily be reduced under 1%. Accordingly, for instance, in the case wherein the scatter of the resistance values of the resistors 101 to 104 is 1%, the changeover frequency of each switch, i.e. the clock frequency at the terminal 13 is 10 KHz and the permissible fluctuation of the output voltage is one-millionth of a maximum output, it suffices that the time constant of the smoothing circuit 110 be 0.1 sec. By raising the clock frequency, the time constant of the smoothing circuit 110 can be made small, or by making the smoothing circuit 110 high-grade, its time constant can be reduced. Further, the scatter of the resistance values can easily be reduced below 1% also in the semiconductor integrated circuit and, if the amount of scatter is decreased, the time constant of the smoothing circuit 110 can be made small. By reducing the time constant of the smoothing circuit 110, the output analog value can be made to quickly follow up variations in the input digital value.

In the embodiment of FIG. 3, the cutoff switches $S_9$ to $S_{12}$ are each connected in series between adjacent ones of the resistors 101 to 104. Accordingly, the same currents flowing through the resistors 101 to 104 flow through the cutoff switches $S_9$ to $S_{12}$; therefore, if ON resistances exist in the cutoff switches $S_9$ to $S_{12}$, their influence is produced.

Figure 9:
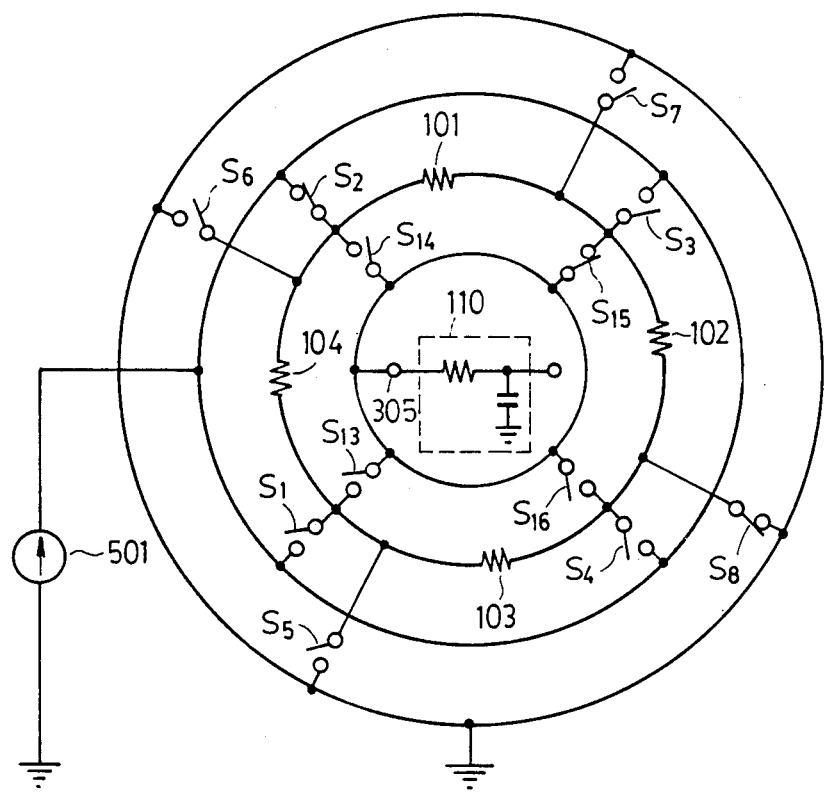
FIG. 9 is a connection diagram illustrating another embodiment of the present invention as being applied to a voltage dividing DA converter employing a constant-current source.

FIG. 9 illustrates an embodiment which is capable of removing the influence of such ON resistance. In this embodiment, the resistors 101 to 104 are connected in the form of a ring without connecting therebetween the cutoff switches $S_9$ to $S_{12}$. The output switches $S_{13}$ to $S_{16}$ are respectively connected at one end to connection points of the resistors 101 to 104 and connected together at the other ends to the output terminal 305. The feed switches $S_1$ to $S_4$ are respectively connected at one end to the connection points of the resistors 101 to 104 and connected together at the other ends to one end of a constant-current source 501. Furthermore, the grounding switches $S_5$ to $S_8$ are respectively connected at one end to the connection points of the resistors 101 to 104 and connected together at the other ends to a common potential point. The other end of the constant-current source 501 is also connected to the common potential point.

With such an arrangement, when any one of the feed switches $S_1$ to $S_4$, for instance $S_2$ is turned ON, the grounding switch $S_8$ which is spaced two resistors apart from the feed switch $S_2$ is turned ON in synchronism with the switch $S_2$. By simultaneously turning ON one of the switches $S_1$ to $S_4$ and those $S_5$ to $S_8$ in such a relation, the connection point of the constant-current source 501 can be circulated through the ring-shaped circuit formed by the resistors 101 to 104 as shown in FIGS. 10A to 10D. By turning ON one of the output switches $S_{13}$ to $S_{16}$ in synchronism with this circulating changeover, a fixed voltage-divided voltage can be taken out using the constant-current source 501. In this embodiment, the four resistors 101 to 104 are connected in the form of a ring and the constant-current source 501 is connected across the parallel connection points of two pairs of series connected resistors, so that voltages one half of the voltage drop induced in both resistors of one parallel branch are selectively taken out at the output terminal 305. For example, if 20 resistors are employed, nine different voltage-divided voltages can selectively be obtained at the output terminal 305. The control of the switches in FIG. 9 may be effected in the following manner: The feed switches $S_1$ to $S_4$ are controlled by the control signals shown in FIGS. 4A to 4D; the grounding switches $S_8$, $S_5$, $S_6$ and $S_7$ are controlled by the control signals shown in FIGS. 4E to 4H; and the output switches $S_{15}$, $S_{16}$, $S_{13}$ and $S_{14}$ are controlled by the control signals shown in FIGS. 4M to 4P. Accordingly, the control of these switches can also be carried out by a controller similar to those illustrated in FIGS. 5, 7 and 8. In the embodiment of FIG. 9, a constant-voltage source can be used instead of the constant-current source 501 without producing significant difference in the analog output.

Figure 10:
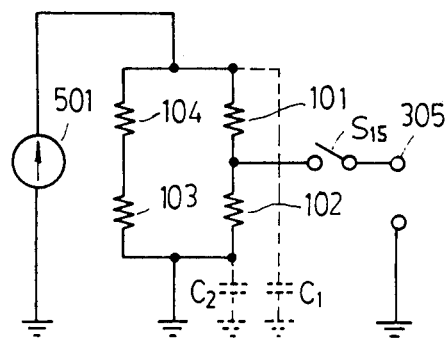
FIGS. 10A to 10D are diagrams showing various changed over states of the converter shown in FIG. 9.
Figure 10:
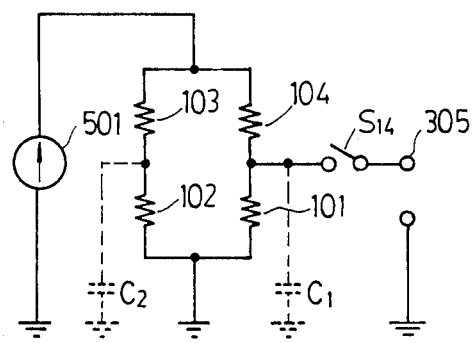

In the embodiment described above in respect of FIGS. 9 and 10A–10D, the resistors are divided into two groups by the turned-ON feed switch and grounding switch, and the voltage dividing point of one of the resistor groups is connected to the output terminal 305. With such an arrangement, however, since a stray capacitance exists between the voltage dividing point of each of the resistors and the common potential point, a spike-shaped noise is introduced into the voltage-divided voltage which is obtained at the output terminal 305 when the switches $S_1$ to $S_4$, $S_5$ to $S_8$ and $S_{13}$ to $S_{16}$ are changed over at high speed. For instance, as indicated by the broken line in FIG. 10A, a stray capacitance $C_1$ exists between the resistor 101 on the side of the power source 501 and the common potential point, and the voltage V is charged in the stray capacitance $C_1$. When the switch is changed over as shown in FIG. 10B, the stray capacitance $C_1$ is connected via the switch $S_{14}$ to the terminal 305 and the voltage V becomes V/2, generating such a spike noise as depicted in FIG. 11A which has a peak value V. To suppress such spike noise, the output switch corresponding to the other resistor group, the switch $S_{13}$ in the example of FIG. 12, is turned ON simultaneously with the switch $S_{15}$ turned ON as shown in FIG. 12. Since a stray capacitance $C_2$ between the common potential point side of the resistor 102 and the common potential point in FIG. 10A is shifted into between the potential of the voltage V/2 by a changeover as shown in FIG. 10B, the voltage that is taken out through the switch $S_{13}$ becomes a negative spike noise as depicted in FIG. 11B. As a result of this, pulse noises that are provided to the output terminal 305 via the switches $S_{15}$ and $S_{13}$, respectively, are cancelled by each other, ensuring that an output voltage free from such spike noise.

Figure 13:
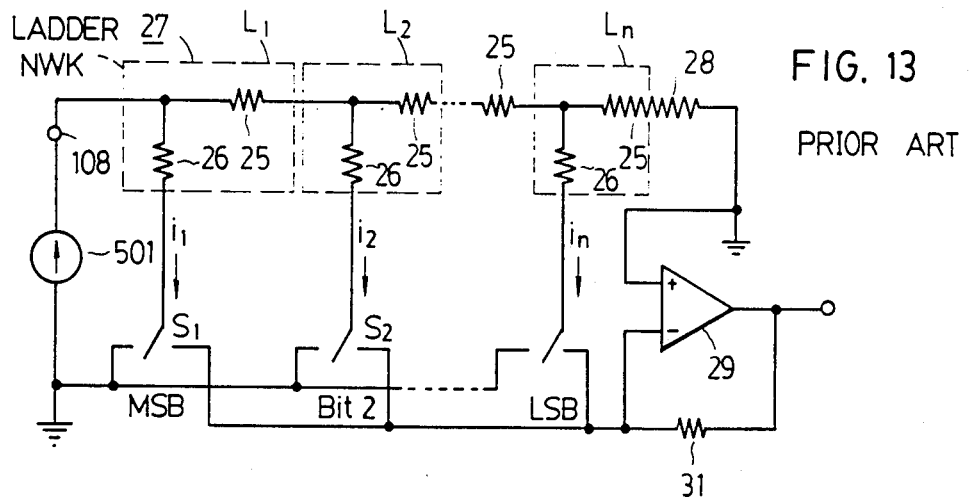
FIG. 13 is a connection diagram illustrating a DA converter using a conventional ladder network.

FIG. 13 shows a DA converter using a conventional ladder network. A ladder network 27 is provided in which sections $L_1, L_2, \ldots L_n$, each composed of a series resistor 25 and a shunt resistor 26, are connected in cascade. The ladder network 27 is connected at one end to the constant-current source 501 and at the other end to the common potential point via a resistor 28. The other ends of the shunt resistors 26 of the sections $L_1$ to $L_n$ of the ladder network 27 are respectively connected to movable contacts of changeover switches $S_1$ to $S_n$. One of the fixed contacts of each changeover switch is connected to the common potential point and the other fixed contact is connected to an inverted input side of an operational amplifier 29. A feedback resistor 31 is connected between the output side and the inverted input side of the operational amplifier 29 and its non-inverted input side is connected to the common potential point. The resistance values of each series resistor 25 and the resistors 28 and 31 of the ladder network 27 are represented by R and the resistance value of each shunt resistor 26 is represented by 2R. The changeover switches $S_1$ to $S_n$ are controlled by those bits of a binary input digital value corresponding to them, and are connected to the common potential point or the inverted input side of the operational amplifier 29 depending on whether the bits are "0" or "1". The changeover switch $S_1$ is controlled by the most significant bit MSB of the input digital value and the changeover switch $S_n$ by the least significant bit LSB. Currents $i_1$ to $i_n$ flowing through the shunt resistors 26 of the section $L_1$ to $L_n$ are each given a binary weight. Also in this case, for obtaining high conversion accuracy, it is necessary that the resistance values of the resistors 25 and 26 be highly accurate. The DA converter shown in FIG. 13 can also be adapted so that scattered resistance values are averaged to obtain a high precision converted output by exchanging the sections of the ladder network.

Figure 14:
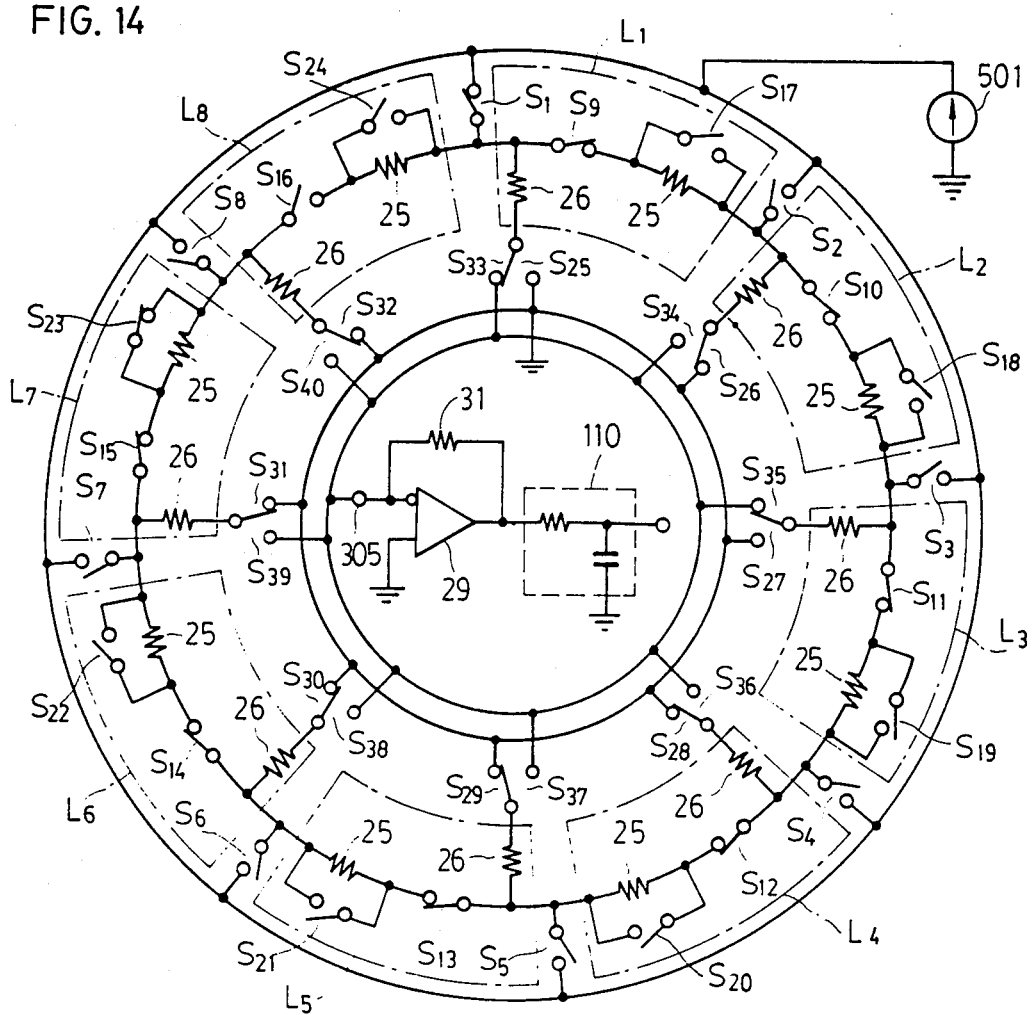
FIG. 14 is a connection diagram illustrating another embodiment of the present invention as being applied to a DA converter using a current mode ladder network.

FIG. 14 illustrates an embodiment of the present invention as being applied to the DA converter employing the ladder network. Eight resistors 25 of the resistance value R are connected in the form of a ring, with the cutoff switches $S_9$ to $S_{16}$ connected between adjacent one of the resistors, and the resistors 26 approximately of the resistance value 2R are each connected at one end to one of the connection points of each cutoff switch and each resistor 25, constituting a ladder network in which sections $L_1$ to $L_8$, each composed of one resistor 25 and one resistor 26, are connected in the form of a ring. Connected in parallel to the resistors 25 are short-circuit switches $S_{17}$ to $S_{24}$. The connection point of the resistor 25 and the cutoff switch in each section is connected via one of feed switches $S_1$ to $S_8$ to the constant-current source 501. The other ends of the resistors 26 are connected to the common potential point via grounding switches $S_{25}$ to $S_{32}$, respectively, and they are also connected to the output terminal 305 via output switches $S_{33}$ to $S_{40}$, respectively. The pairs of the grounding switches $S_{25}$ to $S_{32}$ and the output switches $S_{33}$ to $S_{40}$ connected to each other can be each formed as one changeover switch.

One cutoff switch $S_{16}$ is turned OFF, and the feed switch S and the grounding switch $S_{32}$ connected to the two ends of the cutoff switch $S_{16}$, respectively, are turned ON. Also turned ON is the short-circuit switch $S_{23}$ of the adjacent section $L_7$ connected to the resistor 26 of the section $L_8$ to which the turned-OFF cutoff switch $S_{16}$ belongs. Such an operation, of turning OFF one cutoff switch in one of the ladder sections and, at the same time, turning ON the feed switch and the grounding switch connected to both ends thereof and the short-circuit switch of the adjacent section, is carried out at regular time intervals under the control of the aforementioned control section 11. When one cutoff switch $S_{16}$ is turned OFF, a ladder network by the cascade connection of the sections $L_1$ to $L_7$ is constituted and the section $L_1$ at one end of the ladder network (the first stage of the ladder) is connected to the constant-current source 501. In the section $L_7$ at the other end of the ladder, the resistor 25 is short-circuited by the short-circuit switch $S_{23}$, and the last stage of the ladder network is constituted by the resistance value 2R of the resistor 26 of the section $L_8$ and the resistor 26 of the section $L_7$, and is terminated by the resistance value 2R of the resistor 26 of the section $L_8$. In this way, turning ON the cutoff switches $S_9$ to $S_{16}$ one after another, the ladder network of the seven sections is circulated one section at a time in a fixed direction in FIG. 14.

When one cutoff switch $S_{16}$ is in the OFF state, the output switch $S_{33}$ and the grounding switch $S_{25}$ of the ladder network on the side of the constant-current source 501, that is, of the section $L_1$, are controlled by the most significant bit of the input digital value and, by the least significant bit of the input digital value, the output switch $S_{39}$ and the grounding switch $S_{31}$ of the final stage section $L_7$ are controlled. Likewise, the output switches $S_{34}$ to $S_{38}$ and the grounding switches $S_{26}$ to $S_{30}$ of the sections $L_2$ to $L_6$ are controlled corresponding to those bits of the input digital value corresponding to them. For example, in the case of the input digital value being "1010000", the output switches $S_{33}$ and $S_{35}$ are turned ON. As the cutoff switches to be turned OFF are sequentially changed over, those of the output switches and the grounding switches which are turned ON as the ladder network of the seven sections is sequentially circulated are also changed over while retaining the relative positions on the ring. The control of the output switches $S_{33}$ to $S_{40}$ and the grounding switches $S_{25}$ to $S_{32}$ can be effected by the aforementioned control section 12. FIGS. 15A to 15P show, by way of example, a timing chart of the switch control in FIG. 14 with respect to the case where the input digital value is "1010000".

In the example of FIG. 14 the resistance value of any one of the resistors in the ladder network must be adjusted with sufficiently high accuracy, but no particular adjustment is needed for the other resistors.

Figure 16:
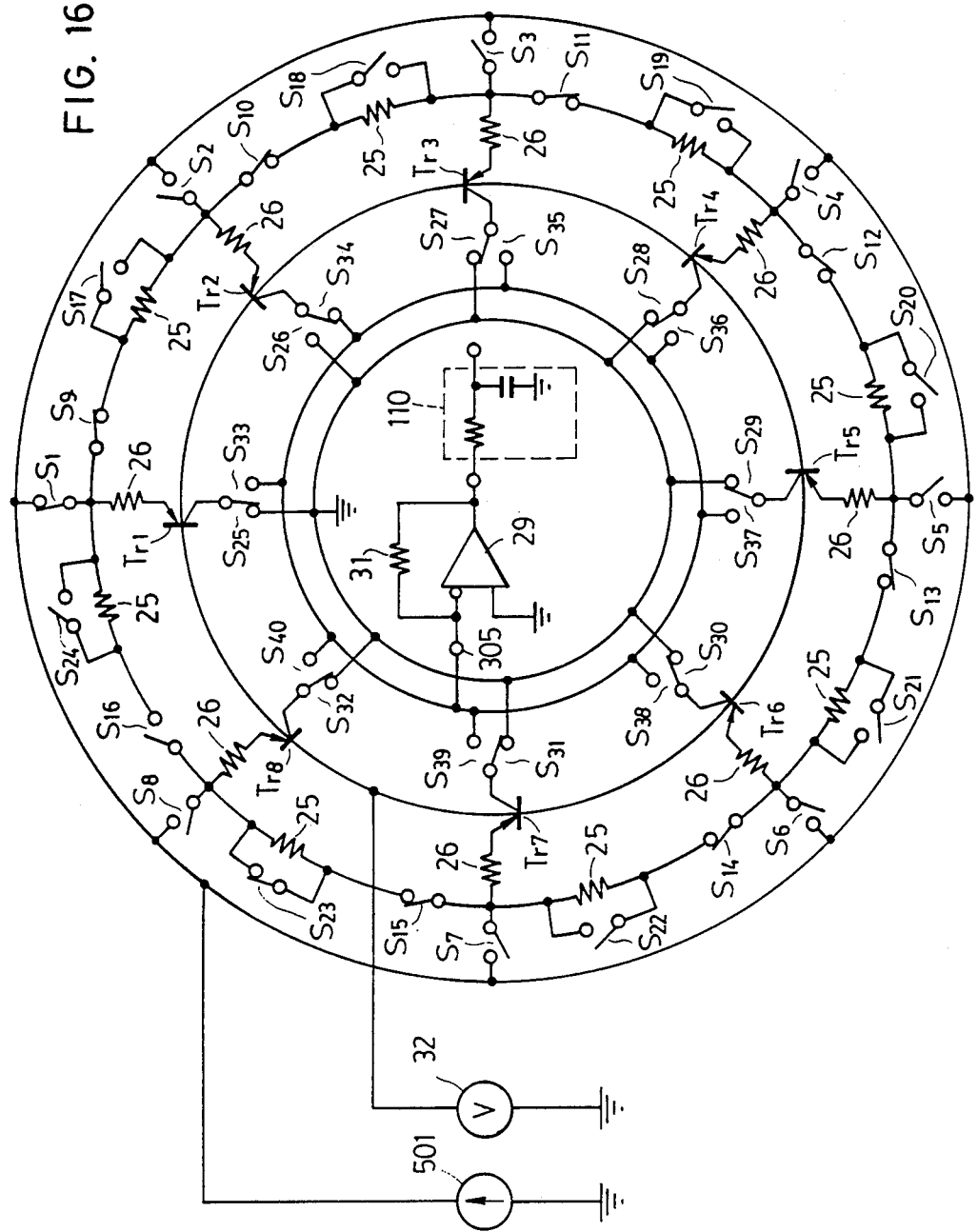
FIG. 16 is a connection diagram illustrating another embodiment of the present invention as being applied to a DA converter using a ladder network.

In the embodiment of FIG. 14, each weighted current is affected by the ON resistances of the grounding switches $S_{25}$–$S_{32}$ and output switches $S_{33}$–$S_{40}$. This influence can be eliminated through utilization of prior art techniques. For instance, as shown in FIG. 16 in which the parts corresponding to those in FIG. 14 are identified by the same reference numerals, emitters of transistors $Tr_1$ to $Tr_8$ are each connected to each shunt resistor 26 on the side opposite from the cutoff switch, and the collector of each transistor is connected to the connection point of the output switch and the grounding switch. The base of each of the transistors $Tr_1$ to $Tr_8$ is supplied with a constant voltage from a power source 32. Accordingly, a fixed current of a weight corresponding to the state of connection at every moment flows in each of the transistors $Tr_1$ to $Tr_8$. For example, in FIG. 16, in the case where the feed switch $S_1$ and the grounding switch $S_{32}$ are in the ON state and the cutoff switch $S_{16}$ is in the OFF state, currents that are one-half of a fixed current flowing in the transistor $Tr_1$ flow in the transistors $Tr_2$ to $Tr_8$ one after another. FIG. 16 shows the case where the input digital value is "0100000", and the output switch $S_{34}$ and the grounding switches $S_{25}$ and $S_{27}$ to $S_{32}$ are turned ON.

Figure 17:
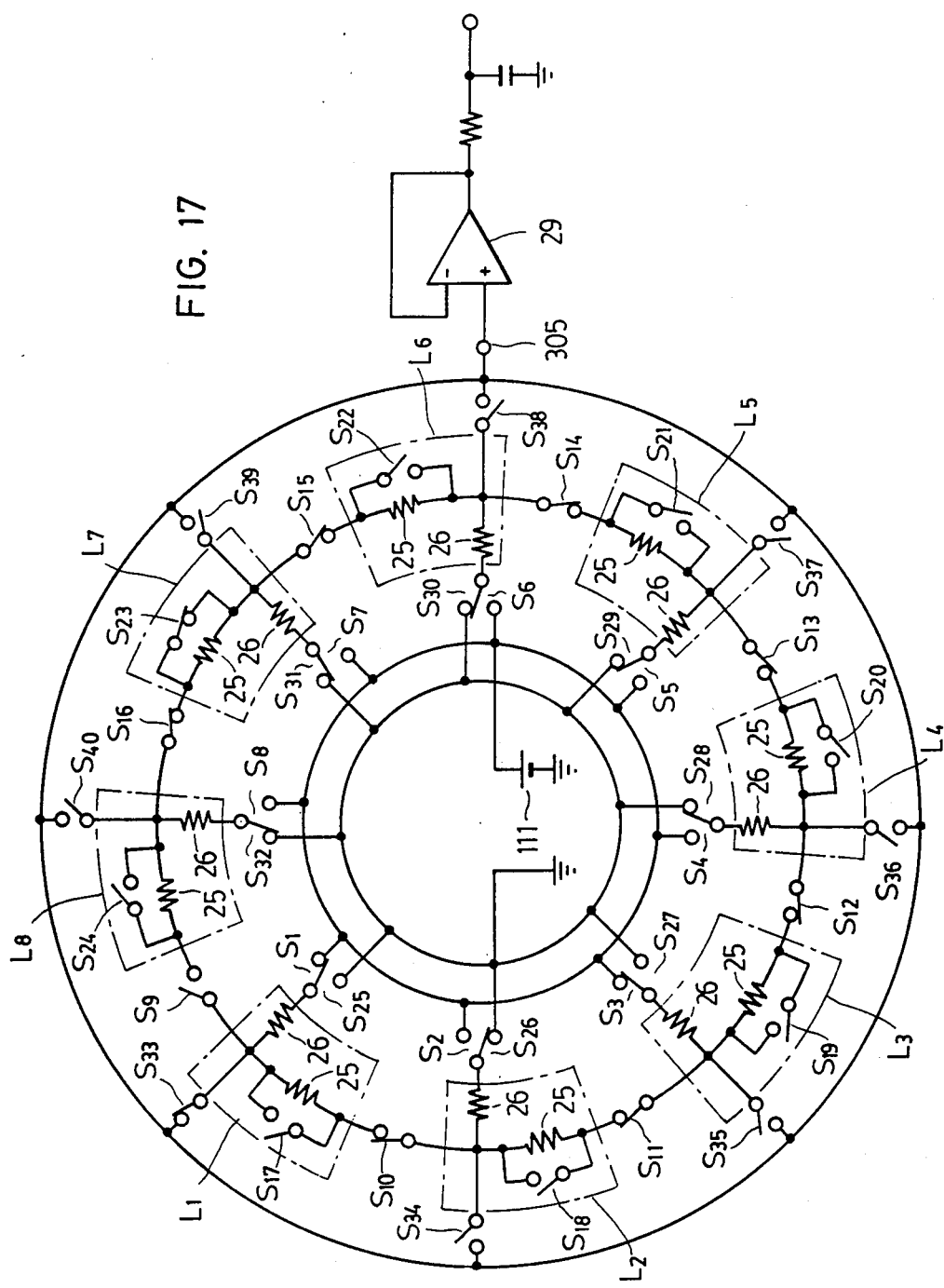
FIG. 17 is a connection diagram illustrating another embodiment of the present invention as being applied to a DA converter using a voltage mode ladder network.

Although in FIG. 14 a ladder network of a current switching mode is employed, the present invention is also applicable to a DA converter using a voltage mode ladder network. An example of such an application is illustrated in FIG. 17, in which the parts corresponding to those in FIG. 14 are indicated by the same reference numerals. In this case, the output switches $S_{33}$ to $S_{40}$ are each connected between respective connection points of the resistors 25 and 26 and the common output terminal 305. The end of each shunt resistor 26 opposite from the resistor 25 is connected to the constant voltage source 111 and the common potential point via one of the feed switches $S_1$ to $S_8$ and one of the grounding switches $S_{25}$ to $S_{32}$ corresponding to the shunt resistor 26. In the state in which one of the cutoff switches, for instance, $S_9$ is in the OFF state, the output switch $S_{33}$ and the grounding switch $S_{32}$ connected to both sides of the switch $S_9$ and the short-circuit switch $S_{23}$ of the first stage $L_7$ of the ladder network at that time are simultaneously turned ON. The cutoff switches $S_9$ to $S_{16}$, the output switches $S_{33}$ to $S_{40}$, the grounding switches $S_{25}$ to $S_{32}$ and the short-circuit switches $S_{17}$ to $S_{24}$ are controlled by the source supply control section 11, and the feed switches $S_1$ to $S_8$ and the grounding switches $S_{25}$ to $S_{32}$ are controlled by the output control section 12 in accordance with the corresponding bits of the input digital value, by which when any of bits of the input digital value is "1", those of the feed switches and the grounding switches corresponding thereto are turned ON. The section of the ladder network connected to the output terminal 305 is made to correspond to the most significant bit of the input digital value. In the example of FIG. 17, there is shown the case of the input digital value being "1010000" and, in the state in which the cutoff switch $S_9$, the feed switches $S_1$ and $S_3$ and the grounding switches $S_{26}$ and $S_{28}$ to $S_{31}$ are turned ON.

It will be apparent that many modifications and variations may be effected without departing from the scope of the novel concepts of the present invention.

What is claimed is:

1. A DA converter for converting from an input digital value to a corresponding analog output, comprising:

N resistance elements of approximately the same resistance value, wherein N is an integer equal to or larger than 2;

N cutoff switches connected alternately with said resistance elements in the form of a ring, with each of the resistance elements connected in series between adjacent ones of the cutoff switches;

N feed switches, each connected at one terminal to a respective alternate one of the connection points of the cutoff switches with the resistance elements;

a power source connected at one terminal in common to the other terminals of the N feed switches;

N grounding switches, each connected between (1) a respective one of the other alternate connection points of the cutoff switches with the resistance elements and (2) the other terminal of the power source;

N output switches, connected between (1) the respective ones of the alternate connection points of the cutoff switches with the resistance elements to which said feed switches are connected and (2) a common output terminal; and control means for sequentially turning OFF each one of the N cutoff switches in turn, while simultaneously turning ON a respective one of the feed switch and the respective grounding switch connected to opposite terminals of the respective turned-OFF cutoff switch, and for selectively turning ON each respective one of the output switches selected in accordance with said input digital value, this operation being repeated with a fixed period for all of the cutoff switches in a sequential order, while retaining the relative positions on the ring of each respective feed switch, grounding switch and output switch which is turned ON with respect to the turned OFF cutoff switch, wherein said corresponding analog output is derived from said common output terminal.

2. The converter of claim 1, wherein N is an integer larger than 2.

3. A DA converter for converting from an input digital signal with a predetermined number of bits to a corresponding analog output signal, comprising:

N first resistance elements of approximately the same resistance value, wherein N is an integer larger than 2, the number of bits of said input digital signal corresponding to N−1;

N cutoff switches alternatively connected with said resistance elements in the form of a ring, with a respective one of the resistance elements connected in series between respective adjacent ones of the cutoff switches;

N feed switches, each connected at one terminal to a respective alternate one of the connection points of a respective one of the cutoff switches with the first resistance elements;

a power source having two terminals and being connected at one of said terminals in common to the other terminals of each of the N feed switches;

N second resistance elements, each connected at one terminal to a respective one of the connection points of the cutoff switches with the first resistance elements to which said N feed switches are connected, and having resistance values approximately twice that of the first resistance elements;

N grounding switches respectively connected between the other terminals of the second resistance elements and in common to the other terminal of the power source;

N output switches respectively connected between said other terminals of the second resistance elements and a common output terminal, the status of each said output switch being opposite to the status of the respective grounding switch connected to the same end of the respective second resistance element;

N short-circuit switches respectively connected in parallel to the first resistance elements; and control means for turning OFF each one of the N cutoff switches in turn, while simultaneously turning on a respective one of the feed switches and the respective grounding switch disposed nearest the opposite respective terminals of each turn-OFF cutoff switch, for turning ON the closest one of the short-circuit switches on the same side of the turned-OFF cutoff switch as the turned-ON grounding switch, and for selectively turning ON the output switches and the grounding switches except said turned-ON grounding switch and the respective output switch in correspondance to respective bits of said input digital signal, the operation being repeated with a fixed period for all of the cutoff switches in a sequential order while retaining the relative positions of the turned-ON grounding switches, short-circuit switches and output switches to each turned-OFF cutoff switch on the ring, wherein said analog output signal is derived from said common output.

4. A DA converter according to claim 3 which further includes transistors, each connected in series between said other terminal of a respective one of the second resistance elements and the respective grounding and output switches connected to the second resistance element, the emitter or source of each said transistor being connected to said other terminal of the respective second resistance element, and means for applying a common potential to the control electrodes of said transistors.

5. A DA converter for converting from an input digital value to a corresponding analog output signal, comprising:

N resistance elements of approximately the same resistance value, connected in series in the form of a ring, wherein N is an integer larger than 2;

N feed switches, each connected at one terminal to a respective one of the connection points of the ring of resistance elements;

a power source having two terminals, and being connected at one of said terminals in common to the other terminals of the N feed switches;

N grounding switches respectively connected between the connection points of the ring of resistance elements and in common to the other terminal of the power source;

N output switches respectively connected between the connection points of the ring of resistance elements and a common output terminal; and control means for simultaneously turning ON each one of the feed switches in turn, while turning ON a selected one of the grounding switches spaced at least one resistance element apart from the respective turned ON feed switch and turning ON a selected one of the output switches corresponding to said input digital value, the operation being periodically repeated for all of the feed switches in a sequential order while retaining the relative positions of the turned-ON grounding and output switches to the turned-ON feed switch on the ring, wherein said analog output signal may be derived at said common output terminal.

6. A DA converter according to claim 5 wherein N is an even number equal to or larger than 4;

said N resistance elements being divided into two different groups of N/2 resistance elements respectively connected in series between each respective turned-ON feed switch and grounding switch; and the control means includes means for simultaneously turning ON the respective output switch which is connected to the connection points of the resistance elements of one of the resistance element groups spaced apart from the power source by the same number of resistance elements as those of the other resistance element group between the turned-ON output switch and the power source.

7. A DA converter according to claim 1, 3, 4, 5 or 6 wherein the control means comprises source supply control means for controlling all of said switches except the output switches, and output control means for selectively controlling the output switches in accordance with the input digital value in synchronism with the source supply control means.

8. A DA converter according to claim 7 wherein the source supply control means comprises an N-phase signal generating means with N outputs, which is supplied with a clock, for yielding a respective output at each one of said N output terminals upon each occurrence of the clock;

wherein said control means is operated to control said switches in said sequential order.

9. A DA converter according to claim 7 wherein the output control means comprises N output terminals, for presetting therein the input digital value, for outputting pattern data to the N output terminals in accordance with the respective digital value and for cyclically shifting the pattern data upon each occurrence of the clock.

10. A DA converter according to claim 9 wherein the output control means is a N-bit circulating shift register.

11. A DA converter according to claim 9 wherein the output control means comprises an N-bit counter for presetting the input digital value and a decoder for decoding the output from the counter to turn ON each respective output switch corresponding to the decoded output.

12. A DA converter according to claim 1, 3, 4, 5 or 6 which further includes a smoothing circuit connected to the common output terminal.

13. A DA converter for conversion from an input digital value with a predetermined number of bits to a corresponding analog output, comprising:

N first resistance elements of approximately the same resistance vlaue, wherein N is an integer larger than two, the number of bits of said input digital value corresponding to N−1;

N cutoff switches connected alternately in series with said first resistance elements in the form of a ring, with each respective one of the first resistance elements being connected at respective connection points with respective adjacent ones of the cutoff switches;

N second resistance elements, each connected at one terminal to a respective alternate one of the connection points of the cutoff switches with the first resistance elements and having a resistance value approximately twice that of the first resistance elements;

N feed switches, each respectively connected at one terminal to the other terminal of a respective one of the second resistance elements;

a power source connected at one terminal in common to the other terminals of the feed switches;

N grounding switches respectively connected between said other terminals of the second resistance elements and in common to the other terminal of the power source;

N output switches respectively connected between the connection points of the first and second resistance elements and a common output terminal;

N short-circuit switches respectively connected in parallel with the first resistance elements; and control means for sequentially turning OFF each one of the cutoff switches in turn, while at the same time turning ON a respective one of the output switches and the respective grounding switch on opposite sides of each respective turned-OFF cutoff switch, for turning ON the short-circuit switch connected to the turned-ON cutoff switch adjacent the turned-OFF cutoff switch on the opposite side of said turned-OFF cutoff switch than the side having said output switch turned ON, and for turning ON the feed switches and the grounding switches connected to the others of said other terminals of said second resistance elements in correspondence to the values of respective bits of said input digital value, the operation being repeated with a fixed period for all of the cutoff switches in a sequential order while retaining the relative positions of the turned-ON grounding switches, short-circuit switch, output switch and feed switches to the turned-OFF cutoff switch on the ring.

14. A DA converter according to claim 13 wherein the control means comprises first control means for controlling said cut-off, switches said output switches, said short-circuit switches and said grounding switches, and second control means for selectively controlling said feed switches, and for controlling said grounding switches in connection with said controlling by said first control means, in accordance with the respective bits of the input digital value.

15. A DA converter according to claim 14 wherein said first control means is an N-phase signal generating means having N output terminals, and which is supplied with clock pulses, for yielding a respective output at each of said terminals in correspondence with said clock pulses.

16. A DA converter according to claim 14 wherein the output control means includes N output terminals, and which is supplied with clock pulses presetting therein the respective bits of the input digital value, for outputting patern data to the N output terminals in accordance with the input digital value and for cyclically shifting the pattern data upon each clock pulse.

17. A DA converter according to claim 16 wherein the output control means is an N-bit circulating shift register.

18. A DA converter according to claim 16 wherein the output control means comprises a $\log_2 N$-bit counter for presetting the input digital value, and a decoder for decoding the output from the counter to turn ON the output switch corresponding to the decoded output.

19. A DA converter according to claim 3 or 4 wherein each said output switch and the respective grounding switch which are connected to said other end of the same second resistance element are formed as one changeover switch.

20. A DA converter according to claim 13 wherein each said feed switch and the respective grounding switch which are connected to said other end of the same second resistence element are formed as one changeover switch.

21. The converter of claim 1, 3, 5 or 13, wherein N is an integer equal to or larger than 8.

22. The converter of claim 2, 3, 4, or 5 said power source being a constant-current source.

23. The converter of claim 1 or 13, said power source comprising a constant voltage source.

* * * * *

UNITED STATES PATENT AND TRADEMARK OFFICE
CERTIFICATE OF CORRECTION

PATENT NO. : 4,459,580

DATED : July 10, 1984

INVENTOR(S) : Yasuo Furukawa

It is certified that error appears in the above-identified patent and that said Letters Patent is hereby corrected as shown below:

On the title page
Column 1, after "Primary Examiner --C.D. Miller" insert --Attorney, Agent, or Firm -- Staas & Halsey--;

[57] ABSTRACT, line 7, "elements" should be -- element--.

Column 3, line 31, after "end" insert --108--.

Column 7, line 40, "wherein" should be --in which--.

Column 9, line 16, after "noise" insert --is obtained--;
line 57, after "with" insert --one of--;
line 59, "one" should be --ones--;
line 59, after "26" insert --of--;
line 60, delete "of".

Column 10, line 10, "S" should be --$S_{16}$--.

Claim 8, line 3, "outputs" should be --output terminals--.

Claim 14, line 3, delete "," (first occurrence).

Signed and Sealed this

First Day of January 1985

[SEAL]

Attest:

GERALD J. MOSSINGHOFF

Attesting Officer   Commissioner of Patents and Trademarks